(12) United States Patent
Kim et al.

(10) Patent No.: US 8,716,779 B2
(45) Date of Patent: May 6, 2014

(54) FLASH MEMORY DEVICE AND MASK FOR FABRICATING THE SAME

(75) Inventors: Mi Hye Kim, Seoul (KR); Dong Sook Chang, Gyeonggi-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 100 days.

(21) Appl. No.: 12/648,719

(22) Filed: Dec. 29, 2009

(65) Prior Publication Data

US 2011/0024817 A1    Feb. 3, 2011

(30) Foreign Application Priority Data

Jul. 30, 2009    (KR) .................. 10-2009-0070200
Jul. 30, 2009    (KR) .................. 10-2009-0070201

(51) Int. Cl.
*H01L 29/76*    (2006.01)
(52) U.S. Cl.
USPC .................. 257/314; 257/315; 257/E29.3
(58) Field of Classification Search
USPC ............................................. 257/314–315
See application file for complete search history.

(56) References Cited

U.S. PATENT DOCUMENTS

| | | | |
|---|---|---|---|
| 6,380,032 B1 * | 4/2002 | Lee et al. | 438/257 |
| 6,583,465 B1 * | 6/2003 | Kim et al. | 257/314 |
| 7,384,845 B2 | 6/2008 | Lee | |
| 2003/0007386 A1 * | 1/2003 | Georgakos et al. | 365/185.17 |
| 2005/0037572 A1 * | 2/2005 | Lee | 438/257 |
| 2005/0173743 A1 * | 8/2005 | Sim et al. | 257/296 |
| 2005/0230738 A1 * | 10/2005 | Lee | 257/315 |
| 2006/0120154 A1 * | 6/2006 | Lee | 365/185.17 |
| 2006/0245233 A1 * | 11/2006 | Mikolajick et al. | 365/100 |
| 2007/0297233 A1 * | 12/2007 | Maejima | 365/185.17 |
| 2009/0097316 A1 * | 4/2009 | Lee | 365/185.13 |
| 2009/0215236 A1 * | 8/2009 | Eppich | 438/239 |
| 2009/0290403 A1 * | 11/2009 | Tamon | 365/51 |
| 2010/0091569 A1 * | 4/2010 | Higashitani | 365/185.11 |
| 2010/0148220 A1 * | 6/2010 | Byeon | 257/208 |

FOREIGN PATENT DOCUMENTS

| | | | |
|---|---|---|---|
| KR | 1020050017485 A | | 2/2005 |
| KR | 1020070036525 A | | 4/2007 |
| KR | 1020070048909 A | | 5/2007 |
| KR | 2008-030308 | * | 4/2008 |
| KR | 1020080084064 A | | 9/2008 |
| KR | 1020090003715 A | | 1/2009 |
| KR | 10-2009-0076138 | * | 7/2009 |
| KR | 10-2009-0095395 | * | 9/2009 |

* cited by examiner

*Primary Examiner* — Ahmed Sefer
(74) *Attorney, Agent, or Firm* — Ladas & Parry LLP

(57) ABSTRACT

A flash memory device includes an active region, drain contacts, a source contact line, and source contacts. The active regions are formed on a substrate extend at least from a source region to a drain region of the substrate. The drain contacts are formed over the active regions in the drain region. The source contact line is formed in the source region of the semiconductor substrate. The source contact line intersects the active regions and is continuously line-shaped. The source contact line includes source contacts formed at locations where the source contact line and the active regions intersect. The source contacts are zigzag-shaped and are separated from corresponding drain contacts by a given distance.

11 Claims, 12 Drawing Sheets

(a)

(b)

US 8,716,779 B2

FLASH MEMORY DEVICE AND MASK FOR FABRICATING THE SAME

CROSS-REFERENCE TO RELATED APPLICATION

The present application claims priority to Korean patent application numbers 10-2009-0070200 and 10-2009-0070201, filed on 30 Jul. 2009, which is incorporated by reference in its entirety.

BACKGROUND OF THE INVENTION

The present invention relates generally to a memory device and fabrication of the same. More particularly, the present invention relates to a flash memory device, and a mask for fabricating the same.

The demand for semiconductor memory that is electrically programmable and erasable and that can retain stored information when not powered is growing. Flash memory is an electrically erasable programmable read only memory (EE-PROM) that is widely used as a nonvolatile memory, that is, a memory capable of retaining stored information when power is interrupted.

Further, high-integration technology is constantly being developed in an attempt to develop large-capacity memory devices capable of storing a large quantity of data in increasingly limited space. For this, a NAND type flash memory device has been proposed in which a plurality of memory cells are serially connected to form a single string and a plurality of the strings constitute a single memory cell array.

A flash memory cells of a NAND flash memory device includes a current pass formed over a semiconductor substrate between a source and a drain, and further includes a floating gate and a control gate formed over the semiconductor substrate. An insulator is interposed between the floating gate and the control gate.

During a typical programming operation of a flash memory cell, the source of the memory cell and the semiconductor substrate (i.e., a bulk region) are first grounded. A positive high voltage (program voltage: $V_{PP}$, for example 15V to 20V) is applied to the control gate, and a voltage for programming (for example, 5V to 6V) is applied to the drain of the memory cell, in order to generate hot carriers. The hot carriers are generated as electrons in the bulk region accumulate on the floating gate due to the electric field of the high voltage $V_{PP}$ applied to the control gate, and as charges supplied to the drain are continuously accumulated.

The erasing operation of a flash memory cell is simultaneously performed for flash memory cells in a sector unit sharing a bulk region. The erasing operation is performed by applying a negative high voltage (erase voltage: $V_{era}$, for example −10V) to the control gate and applying a given voltage (for example, 5V) to the bulk region to cause Fowler-Nordheim tunneling (F-N tunneling). The F-N tunneling causes the electrons accumulated on the floating gate to be discharged toward the source (that is, electrons tunnel from the floating gate to the source) so that the flash memory cells have an erase threshold voltage that ranges from about 1V to 3V.

In other words, the programming operation increases the threshold voltage of a cell transistor by causing channel hot electrons to jump onto (i.e., accumulate on) the floating gate; and the erasing operation of the flash memory cell lowers the threshold voltage of the cell transistor by generating a high voltage between the source/the substrate and the floating gate to discharge the electrons accumulated on the floating gate.

However, flash memory has problems such as bridge generation between drain contacts, instability of electrical distribution characteristics between the source contact of the source region and the drain contact of the drain region, and the like.

BRIEF SUMMARY OF THE INVENTION

In an embodiment of the present invention the electrical characteristics of a flash memory device are improved by ensuring a given distance between a drain contact and a source contact in an active region. Also, in an embodiment of the present invention a photo process margin can be improved in a lithography process by forming the source contact as a line type.

In an embodiment, a memory device comprises: an active region formed over a semiconductor substrate and a device isolation film defining the active region; a drain contact formed in a drain region over the active region; a source contact line formed in a source region of the semiconductor substrate, wherein the source contact line intersecting with the active region is continuously line-shaped; and a source contact intersecting with the source contact line and the active region to be zigzag-shaped, wherein the source contact is separated from the drain contact with a given distance.

Further, the source contact line comprises: a vertical line formed parallel to the active region; and a curved line disposed between the vertical lines, wherein the curved line is curve-shaped extending from an edge portion of the vertical line, so that it is preferably to form a mask pattern over a reticle.

Preferably, the source contact is formed over the curve line.

Further, the source contact line comprises a plurality of sloped lines continuously connected to each other, each of which is formed at a given angle with respect to the active region.

Preferably, the source contact is formed on a region where the plurality of sloped lines are connected to each other, and preferably, the drain contact is disposed in a zigzag shape.

In addition, the flash memory device further comprises two drain selection lines formed vertically crossing the active region in the drain region, wherein the drain contact is formed between the two drain selection lines.

In addition, the flash memory device further comprises two source selection lines formed vertically crossing the active region in the source region, wherein the source contact is formed between the two source selection lines.

In addition, the flash memory device further comprises a plurality of gates formed vertically crossing the active region between the source region and the drain region.

Meanwhile, a mask for fabricating a flash memory device according to the present invention is to form a source contact in a flash memory device, in which the mask comprises all source contact regions and source contact lines continuously connected to each other to form the flash memory device, so that it keeps a given distance between the drain contact and the source contact.

In addition, the source contact line comprises a horizontal line formed perpendicular to an active region; and a vertical line formed parallel to the active region and continuously connected from the horizontal line to another horizontal line, and the source contact line comprises a plurality of sloped lines continuously connected to each other, each of which is formed at a given angle with respect to the active region.

Preferably, the mask further comprises a pattern corresponding to a drain contact having a contact hole type.

DESCRIPTION OF EMBODIMENT

Hereafter, specific embodiments of the present invention will be described in detail with reference to the accompanying drawings.

Figure 1:
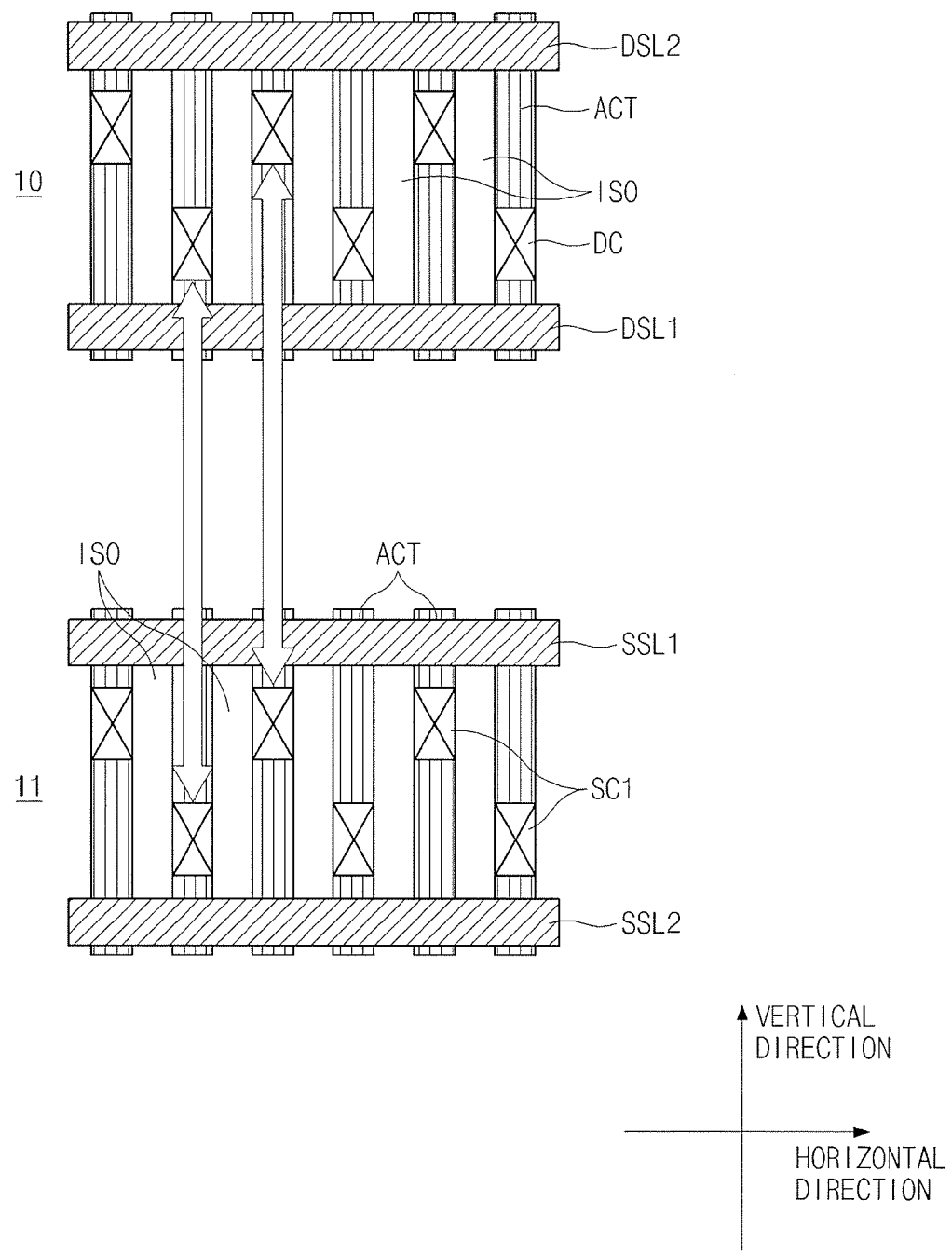
FIGS. 1 and 2 are top views showing a flash memory device according to an embodiment of the present invention.
Figure 2:
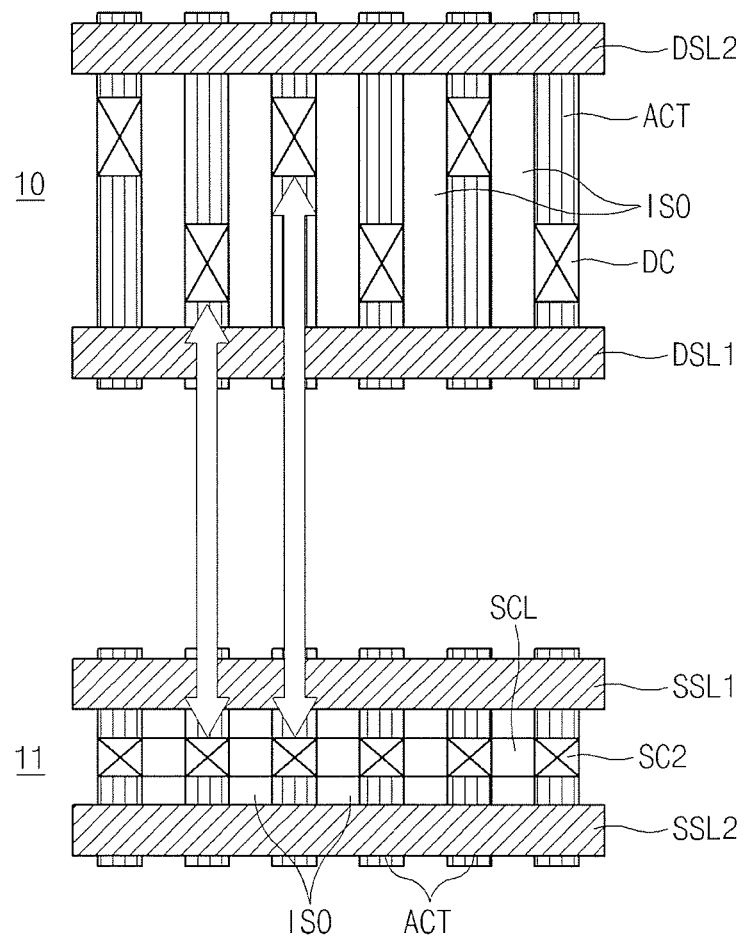

FIGS. 1 and 2 are top views showing a flash memory device according to an embodiment of the present invention. Referring to FIG. 1, a substrate includes a drain region 10 (top of FIG. 1) and a source region 11 (bottom of FIG. 1). The flash memory device comprises active regions ACT formed to extend in a first direction (e.g., vertical direction in the view shown in FIG. 1) on a substrate and a device isolation film ISO defining and isolating the active regions ACTs. The drain region 10 corresponds to drain areas of the active regions ACTs of a cell array and the source region 11 corresponds to source areas of the active regions of a cell array.

Drain selection lines DSL1, DSL2 are formed over the drain region 10 and extend in a second direction (e.g., horizontal direction in the view shown in FIG. 1) and cross the active regions ACT. In addition, source selection lines SSL1, SSL2 are formed over the source region 11 and extend in the second direction so as to cross the active region ACT.

Not shown in FIG. 1, a plurality of gates G1, G2 (see instead, e.g., FIG. 3) are formed over the space between the source region 10 and the drain region 11. The gates extend in a direction that is substantially the same as that of the source and drain selection lines, and thus cross the active region ACT. In order to avoid obscuring the invention, only the drain and source regions 10, 11 (i.e., top and bottom portions) of the active region ACT are shown in FIG. 1; however, it should be understood that the active region ACT is connected continuously from the drain region 10 to the source region 11, as is shown, e.g., in FIG. 3.

Two drain selection lines DSL1, DSL2 and two source selection lines SSL1, SSL2 are shown in FIG. 1. The drain selection line DSL2 disposed in the upper portion and the source selection line SSL2 disposed in the bottom portion are each used in another cell array (not shown). For example, the source selection line SSL2 is used in a cell array adjacent to the cell array to which the drain selection line DSL1 is used, and the drain selection line DSL2 is used in a cell array adjacent to the cell array to which the drain selection line DS1 corresponds is used. A drain contacts DC are formed on the active region ACT between the two drain selection lines DSL1, DSL2. Also, a source contacts SC1 are formed on the active region ACT between the two source selection lines SSL1, SSL2.

Meanwhile, as shown in FIG. 1, any two adjacent drain contacts DC are arranged so as to not be aligned with each other in the second direction (or horizontal) direction. The source contacts SC1 are also arranged such that any two adjacent source contacts are not aligned with each other in the second direction. In an embodiment, the drain contacts (and similarly the source contacts) form a zigzag-shape with each other in neighboring active regions (hereinafter, the term 'zigzag shape' is defined as consecutive contacts being alternately disposed up and down in the first/vertical direction).

When the drain contacts DC (and similarly the source contacts SC1) are aligned with each other, bridging occurs between adjacent drain contacts DC (or between adjacent source contacts SC1). The probability of the occurrence of bridging becomes high as available size is decreased to further the goals of high integration. In the embodiment shown in FIG. 1, the drain contacts DC and the source contacts SC1 are each formed in as a zigzag-shaped contact hole type, whereby bridging between adjacent drain contacts DC or adjacent source contacts SC1 can be prevented. Furthermore, the embodiment shown in FIG. 1 allows a photo process margin to be secured during the lithography process of the drain contact DC and the source contact SC1 for contact hole patterns.

In addition, the zigzag-shape of the drain and source contacts facilitates uniformity in the electric paths between source contacts SC1 and corresponding drain contacts DC of the active regions ACT, whereby the electrical characteristics of a flash memory device can be better maintained.

FIG. 2 shows a flash memory device according to another embodiment of the present invention. Like elements are designated by the same reference numerals, and details thereof will be omitted for brevity.

Referring to FIG. 2, the layout of the active regions ACTs, the device isolation film ISO, the drain selection lines DSL1, DSL2, and the source selection lines SSL1, SSL2 may be the same as that of the embodiment shown in FIG. 1. However, the embodiment shown in FIG. 2 is different in that the source contacts SC2 are formed by forming a line type source contact line SCL rather than a contact hole pattern.

The source contact line SCL comprises a plurality of the source contacts SC2 at points at which the source contact line intersects with the active regions. The source contact line is formed in such a way as to reduce the chip size of a flash memory device in the first (vertical) direction. Using the source contact line, the source contact SC2, when being formed with a lithography process, can secure more photo process margin than the contact hole pattern. And this source contact line SCL comprising a plurality of the source contacts SC2 can comprise conductive material such as polysilicon or tungsten.

Figure 3:
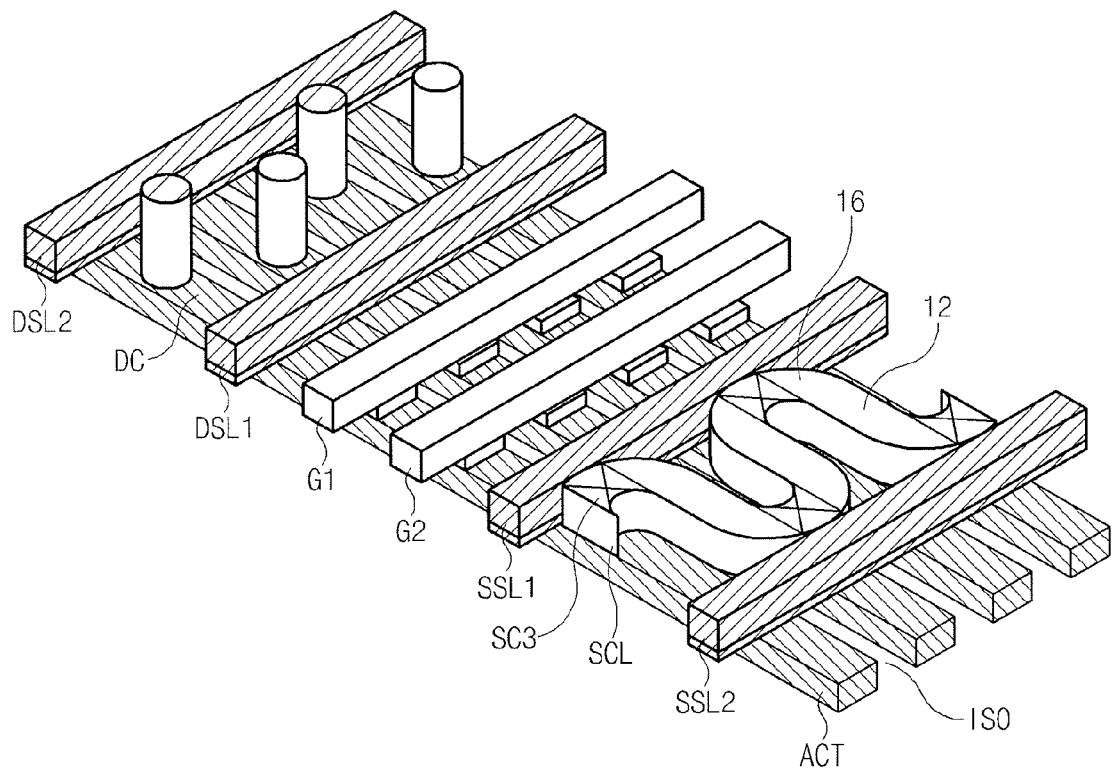
FIG. 3 is a perspective view showing a flash memory device according to an embodiment of the present invention.
Figure 4:
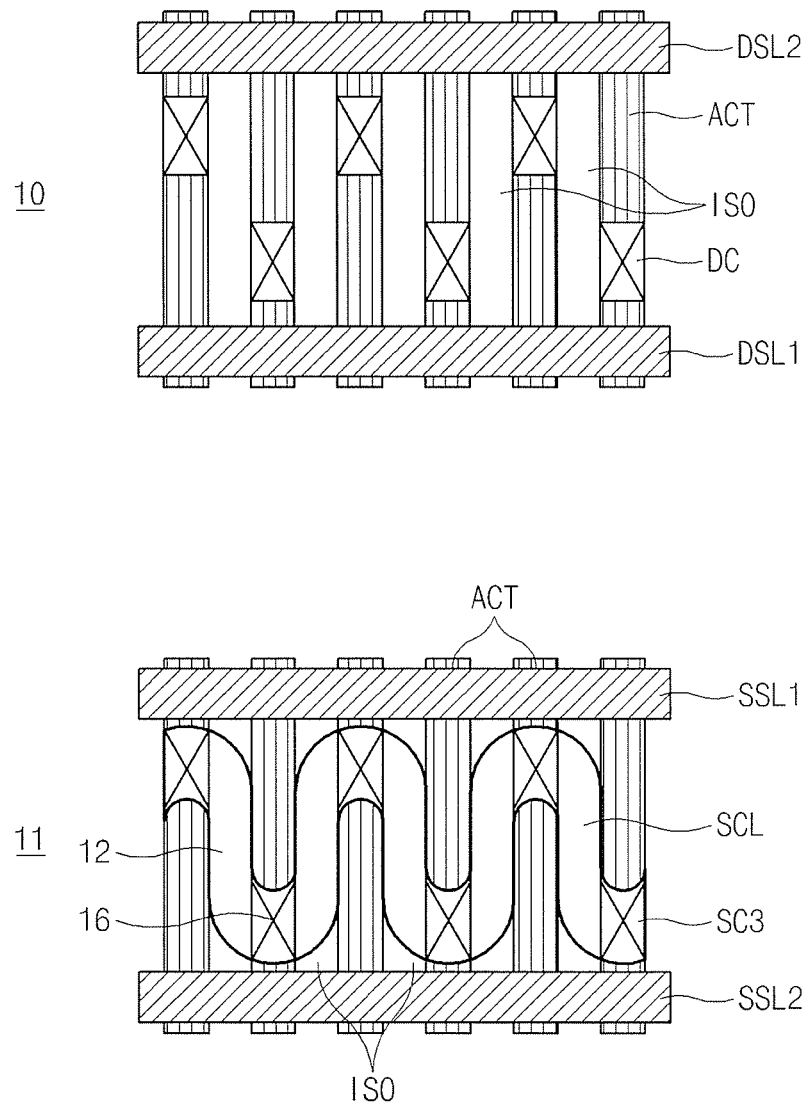
FIGS. 4 and 5 are top views showing a flash memory device according to an embodiment of the present invention.
Figure 5:
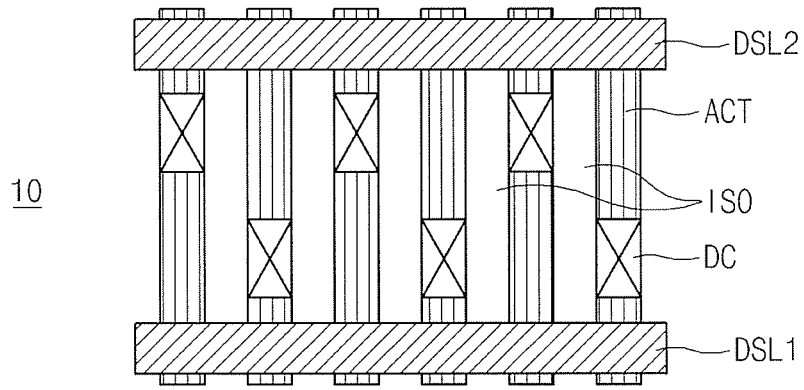
Figure 5:
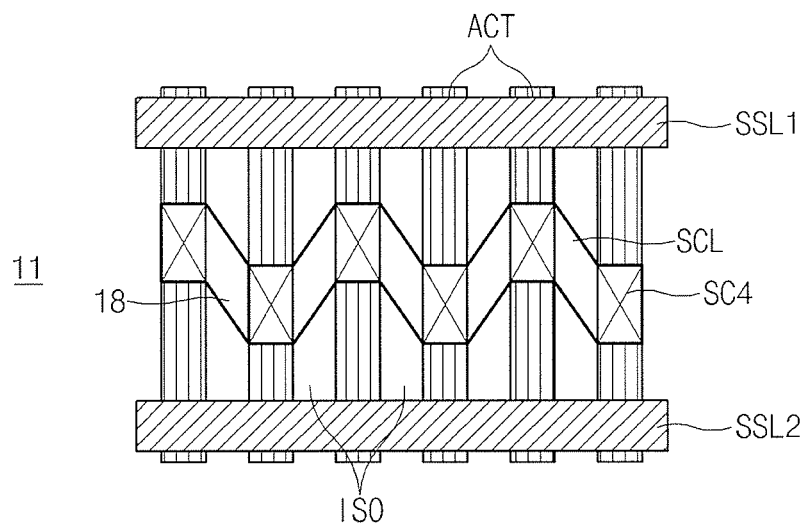

FIGS. 3 through 5 show a flash memory device according to another embodiment of the present invention. FIG. 3 is a schematically perspective view of the three-dimensional structure of the flash memory device shown in FIG. 4. As will be described, the embodiments illustrated in FIGS. 3 through 5 can solve problems that have been found to be associated with the embodiments of FIGS. 1 and 2.

In the embodiments of FIGS. 3 through 5, the layout of the active regions ACT, the device isolation film ISO, the drain selection lines DSL1, DSL2, and the source selection lines SSL1, SSL2 may be the same as that of the embodiments shown in FIGS. 1 and 2. In addition, in order to not obscure the invention, only two gates G1, G2 are shown in FIG. 3; however, the number of gates may be increased up to any value according to design changes by those skilled in the art.

Referring FIGS. 3 through 5, a line-type source contact line SCL including source contacts SC3 is formed. The source contacts SC3 are formed on the line-type source contact line SCL so as to be continuously connected to each and to have the zigzag shape. The source contacts SC3 are located at portions of the source contact line SCL where the source contact line SCL is in contact with the active region ACT. The source contacts SC3 of the source contact line are formed on the same locations as the source contacts SC1 shown in FIG. 1. Therefore, the electric paths between the drain contacts DC and the source contacts SC3 can be kept uniform to maintain electrical characteristics of a flash memory device.

Accordingly, the source contact line SCL and the source contacts SC3 of the embodiments of FIGS. 3 through 5, are formed with a line-type pattern; in contrast to the contact hole-type source contact SC1 of FIG. 1, thereby securing enough photo process margin during the lithography process. In addition, the electric path can be kept uniform among the drain contacts DC and source contacts SC3 of the source contact line SCL in contrast to the line-type source contact line SCL of FIG. 2, whereby device characteristics can be better maintained. There is a difference in shape between the source contact lines SCL shown in FIGS. 4 and 5, and the shape of these source contact lines SCL is described below.

(1) The source contact line SCL in FIG. 4 comprises vertical lines 12 formed parallel to the active region ACT, and curved lines 16 extending from edge portions of two adjacent vertical lines 12 so as to connect the two adjacent vertical lines. In the embodiment shown in FIG. 4, the vertical lines 12 are formed on the device isolation film ISO, and the curved lines 16 connecting the vertical lines pass over and intersect the active region ACT. Accordingly, the source contacts SC3 are located on the curved line 16 of the source contact line SCL.

As shown in FIG. 4, the use of the vertical lines 12 and the curved lines 16 allows for smooth extension of the source contact line over the active regions ACTs, thereby allowing for easy formation of a mask pattern on a reticle. In addition, during the photo process for forming the source contact line SCL using such a reticle, an optical proximity effect occurs less to secure more photo process margin.

(2) The source contact line SCL in FIG. 5 includes a plurality of sloped lines 18 with adjacent sloped lines being connected to each other. Each of the sloped lines is formed at a given angle with respect to the active region ACT (as well as with respect to source selection lines SSL1, SSL2). The source contacts SC4 are located at upper and lower protruded portions of the source contact line SCL where any two adjacent sloped lines 18 connect. The source contacts SC4 still keep the same electric path with their respective drain contacts DC.

The source contact line SCL having the plurality of sloped lines 18 connected to each other as shown in FIG. 5 helps to prevent a short between the source contact line SCL and the active region ACT. In the embodiment in FIG. 4, the vertical line 12 is formed over the device isolation film ISO between two active regions ACT. When patterning is not exact, a short may occur between the vertical line 12 and the neighboring active region ACT, thereby causing deterioration in electrical characteristics. However, since the source contact line SCL in FIG. 5 includes a plurality of sloped lines 18 continuously connected to each other, the source contact line SCL can prevent a short between the source contact line SCL and the active region ACT.

Figure 6:
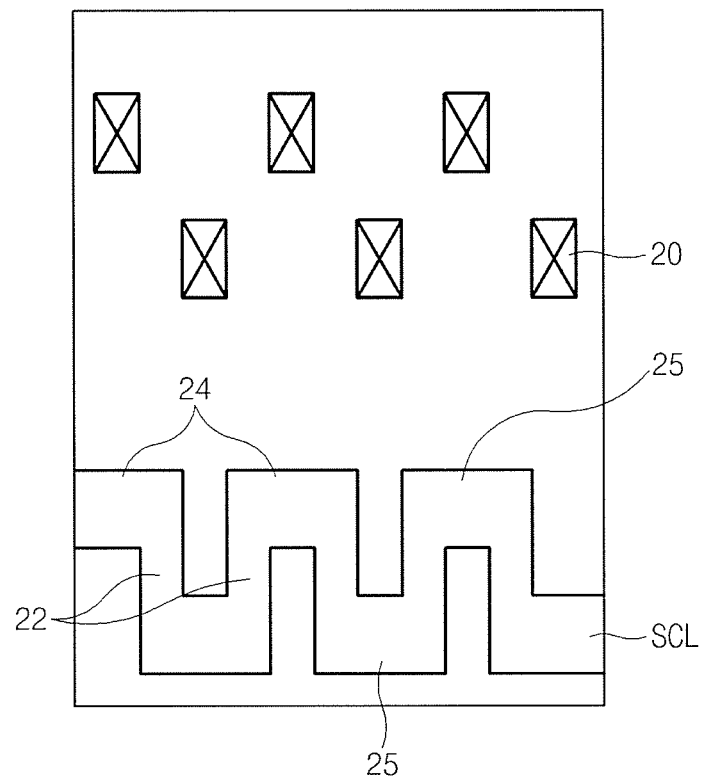
FIGS. 6 and 7 show a mask for fabricating a flash memory device according to an embodiment of the present invention.
Figure 7:
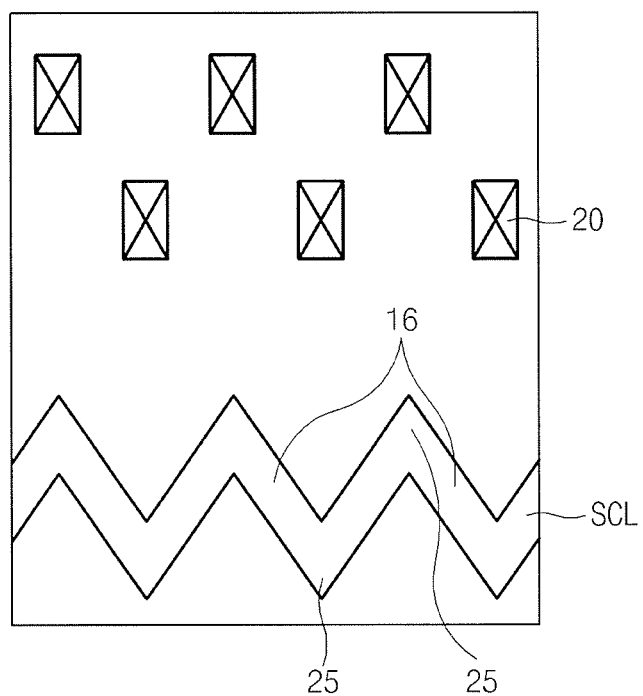

Meanwhile, FIGS. 6 and 7 illustrate a mask (reticle) for fabricating a flash memory device according to an embodiment of the present invention. FIG. 6 shows a mask for forming the source contact line SCL and the drain contacts DC of FIG. 4, and FIG. 7 shows a mask for forming the source contact line SCL and the drain contacts DC of FIG. 5.

Each of the masks shown in FIG. 6 and FIG. 7 include a pattern 20 for forming contact hole type drain contacts DC in the upper portion of the mask. The pattern 20 may be separately formed; however, when the pattern 20 is formed with source contact line SCL pattern, the lithography process can be simplified. Each of the masks shown in FIGS. 6 and 7 include a source contact line SCL pattern. The source contact line SCL pattern has portions corresponding to source contact forming regions 25. The source contact forming regions 25 correspond to the positions where the source contacts SC will be formed on the actual device. The source contact line SCL pattern extends continuously through each of the source contact forming regions.

In order to form the source contact line SCL including the vertical lines 12 and the curved lines 16 shown in FIG. 4, a pattern including vertical lines 22 and horizontal lines 24 is formed on the mask. Although the horizontal lines 24 are straight lines on the mask, curved lines are formed when actually patterned using the lithography process due to the optical proximity effect, whereby the curved lines 16 shown in FIG. 4 may be formed.

In addition, in order to form the source contact line SCL including the sloped lines 18 as shown in FIG. 5, the sloped lines 16 are formed so that adjacent sloped lines directly contact each other as is shown in FIG. 7. Thus, a pattern is formed in which the neighboring sloped lines 16 are symmetrical.

Figure 8A:
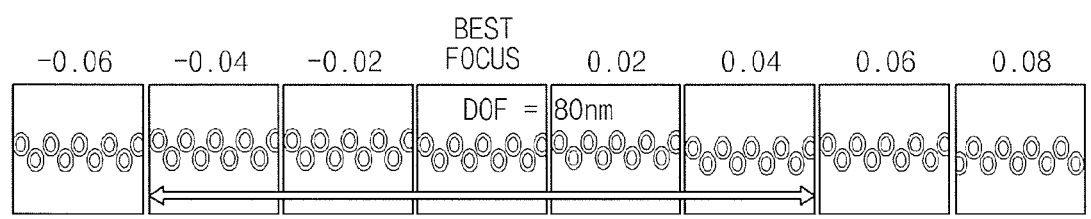
FIGS. 8a and 8b illustrate a depth of focus (DOF) margin of a flash memory device according to an embodiment of the present invention.
Figure 8B:
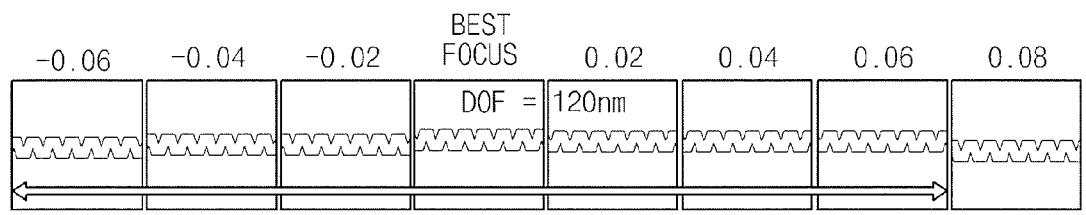

FIGS. 8a and 8b illustrate a depth of focus (DOF) margin of a flash memory device according to an embodiment of the present invention. FIG. 8a shows a DOF margin for forming the contact hole type source contact SC1 in FIG. 1. The DOF margin is about 80 nm. FIG. 8b shows a DOF margin for forming the line type source contact line SC2 in FIGS. 3 and 4, and for example, the DOF margin is about 120 nm. This is because the DOF margin of the contact hole pattern is smaller than that of the line pattern. The present invention uses a difference between margins in FIG. 8a and FIG. 8b to improve a photo process margin while maintaining electrical characteristics of a flash memory device.

Meanwhile, FIGS. 9 to 12 illustrate further embodiments of the present invention.

Figure 9:
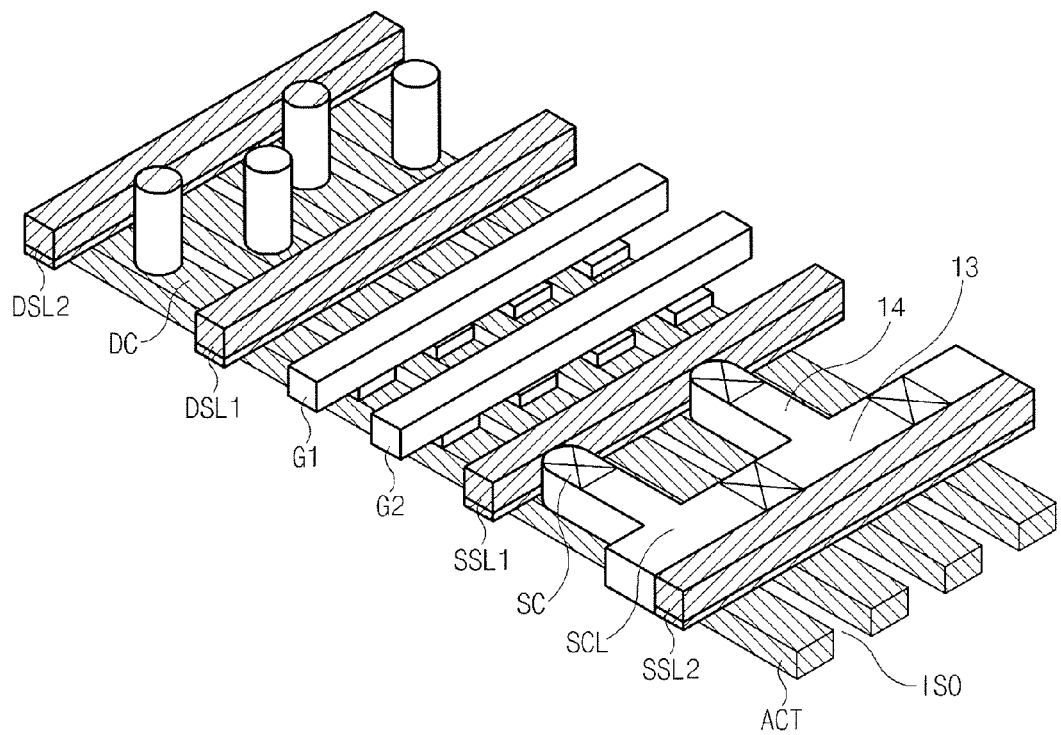
FIGS. 9 and 10 are a perspective view and a top view showing a flash memory device according to another embodiment of the present invention.
Figure 10:
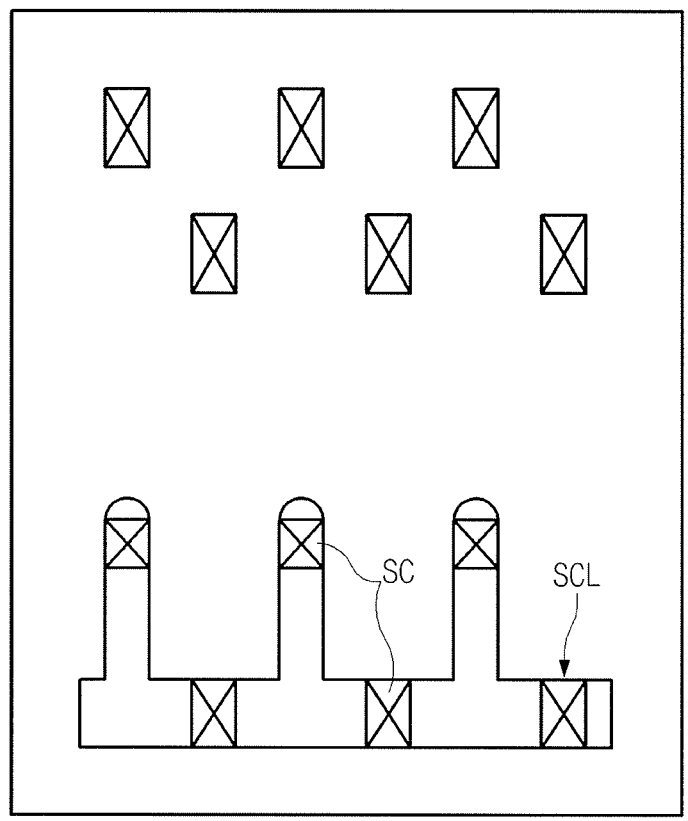

In the embodiment shown in FIGS. 9 and 10, The source contact line SCL also includes source contacts which are in the zig-zag shape. The source contact line SCL of FIGS. 9 and 10 includes a parallel line 13 formed as a straight line extending in the second/horizontal direction. The source contact line SCL further includes protrusion portions 14 protruding so as to extend from the parallel line to drain contacts DC of the source contact line SCL. Thus, similar to previous embodiments, the source contacts SC are located where the source contact line SCL and the active region ACT are in contact with each other and further are formed at the same locations as the source contacts SC shown in FIG. 1. Therefore, the electric path between the drain contacts DC and the source contacts SC can be kept uniform to maintain electrical characteristics of a flash memory device.

The structure of the source contact line SCL shown in FIGS. 9 and 10 will now be described in more detail. The source contact line SCL includes the straight line 13 extending in the second/horizontal direction (that is, in a direction perpendicular to the active region), and protrusion portions 14 each formed over one of the active regions ACT. In addition, the source contacts SC are formed the protrusion portions 14 and on portions of the horizontal line 13 where protrusion portion 14 is not disposed so as to keep the electric paths with the zigzag-shaped drain contacts DC uniform.

Since the source contact line SCL formed with the horizontal lines 12 and the protruded portions 14 are continuously connected to each other, it is easy to form a mask pattern on a reticle. In addition, during a photo process to form the source contact line SCL with the reticle, the optical proximity effect occurs less to secure more photo process margin. Also, a distance between neighboring protruded portions 14 is kept enough to reduce risk of the occurrence of a short.

Figure 11:
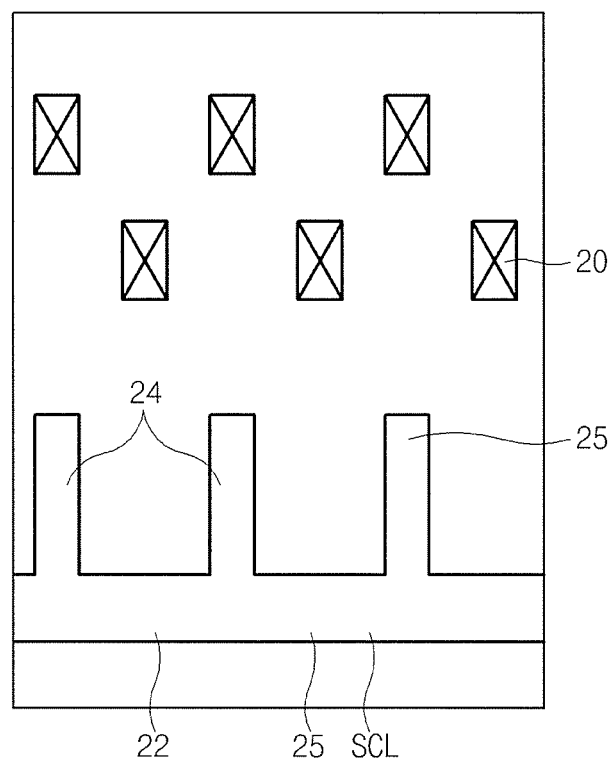
FIG. 11 shows a mask for fabricating a flash memory device according to another embodiment of the present invention.

Meanwhile, FIG. 11 illustrates a mask (reticle) for fabricating a flash memory device according to the present invention. The mask in FIG. 11 includes a pattern 20 for forming a contact hole type drain contact DC in an upper portion of the mask. The pattern 20 can be separately formed; however, when the pattern 20 is formed with a pattern for forming the source contact line, it can simplify a lithography process.

To form the source contact line SCL including the parallel lines 13 and the protruded portions 14 in FIGS. 9 and 10, a pattern including the parallel lines 13 and the protruded portions 14 is formed on the mask, as shown in FIG. 11.

Figure 12:
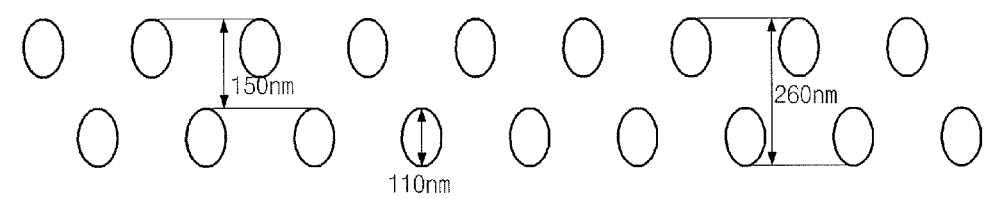
FIG. 12 illustrates the chip size of a flash memory device according to another embodiment of the present invention.
Figure 12:
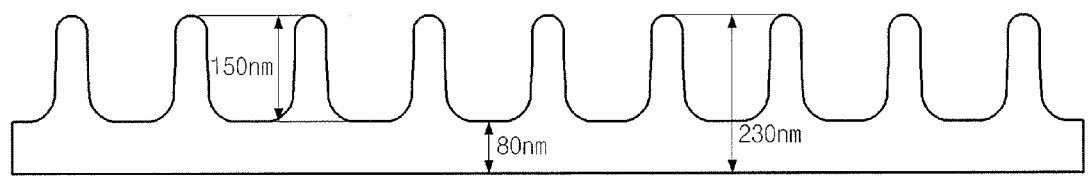

FIG. 12 illustrates the chip size of a flash memory device according to an embodiment of the present invention. Referring to (a) in FIG. 12, a space of total 260 nm in a horizontal direction is needed in order to form the drain contact DC in FIG. 1 to have enough depth of focus (DOF). Referring to (b) in FIG. 12, only a total space of 230 nm in the horizontal direction is needed in order to form the drain contacts DC in FIGS. 3 and 4 having enough DOF.

Since the line type pattern can be patterned smaller than the hole type pattern during a patterning process, in order to form the same process margin, the hole type pattern requires more space than the line type pattern. As a result, the present invention can reduce about 14% of chip size.

In addition, a flash memory in FIG. 1 requires an ArF immersion exposure apparatus to form a contact hole having a line-width of 40 nm, while flash memories in FIGS. 3 and 4 require an ArF Dry exposure apparatus to form patterns, so that it cuts fabricating costs.

A flash memory device of the present invention keeps a given distance between the drain contact and the source contact in an active region to maintain electrical characteristics, and forms the source contact as a line type source contact line to improve a photo process margin in a lithography process.

Although aspects and embodiments of the present invention have been described for illustrative purposes, those skilled in the art will appreciate that various modifications, additions and substitutions are possible, without departing from the scope and the spirit of the invention as disclosed in the accompanying claims.

What is claimed is:

1. A flash memory device, comprising:
    a plurality of active regions formed on a substrate and extending at least from a drain region to a source region of the substrate;
    a plurality of drain contacts formed over the active regions in the drain region;
    a source contact line continuously extending over the plurality of active regions in the source region so as to intersect with the active regions, wherein the source contact line comprises:
        a plurality of source contacts located where the source contact line intersects with the active regions, wherein any two of the plurality of source contacts of adjacent active regions are zigzag-shaped;
        a plurality of vertical lines formed parallel to the plurality of active regions; and
        a plurality of curved lines each of which is extending perpendicular to the active regions between edge portions of any two adjacent vertical lines of the plurality of vertical lines.

2. The flash memory device of claim 1, wherein each of the plurality of source contacts is located in a curved line of the plurality of curved lines.

3. The flash memory device of claim 1, wherein the source contact line comprises a plurality of sloped lines, wherein adjacent sloped lines are connected to each other, and the sloped lines are formed at a given angle with respect to the plurality of active regions.

4. The flash memory device of claim 3, wherein the source contacts are located where adjacent sloped lines are connected to each other so as to connect the adjacent sloped lines.

5. The flash memory device of claim 1, wherein the source contact line comprises:
    a parallel line formed as a straight line extending across the plurality of active regions; and
    a protrusion portion protruding so as to extend from the parallel line to a drain contact of the plurality of drain contacts.

6. The flash memory device of claim 5, wherein the protrusion portion is formed over an active region of the plurality of active regions.

7. The flash memory device of claim 1, wherein the drain contacts are disposed in a zigzag shape.

8. The flash memory device of claim 1, wherein each of the drain contacts corresponds to one of the source contacts, and the electric paths between the drain contacts and corresponding respective source contacts are uniform.

9. The flash memory device of claim 1, further comprising two drain selection lines crossing the plurality of active regions in the drain region, wherein the drain contacts are formed between the two drain selection lines.

10. The flash memory device of claim 1, further comprising two source selection lines crossing the plurality of active regions in the source region, wherein the source contacts are formed between the two source selection lines.

11. The flash memory device of claim 1, further comprising a plurality of gates crossing the plurality of active regions between the source region and the drain region.

* * * * *